United States Patent
Lu et al.

(10) Patent No.: US 8,255,837 B2
(45) Date of Patent: Aug. 28, 2012

(54) METHODS FOR CELL BOUNDARY ISOLATION IN DOUBLE PATTERNING DESIGN

(75) Inventors: Lee-Chung Lu, Taipei (TW); Yi-Kan Cheng, Taipei (TW); Yuan-Te Hou, Hsin-Chu (TW); Yung-Chin Hou, Taipei (TW); Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 308 days.

(21) Appl. No.: 12/616,970

(22) Filed: Nov. 12, 2009

(65) Prior Publication Data
US 2010/0196803 A1     Aug. 5, 2010

Related U.S. Application Data

(60) Provisional application No. 61/149,627, filed on Feb. 3, 2009.

(51) Int. Cl.
*G06F 17/50* (2006.01)

(52) U.S. Cl. .............. 716/50; 716/51; 716/52; 716/53; 716/54; 716/55

(58) Field of Classification Search .............. 716/50–55
See application file for complete search history.

(56) References Cited

U.S. PATENT DOCUMENTS

| | | | | |
|---|---|---|---|---|
| 5,737,236 A | * | 4/1998 | Maziasz et al. | 716/123 |
| 7,810,063 B1 | * | 10/2010 | Sharma et al. | 716/139 |
| 2004/0261048 A1 | * | 12/2004 | Bucki et al. | 716/14 |
| 2005/0138588 A1 | * | 6/2005 | Frenkil | 716/6 |
| 2008/0244503 A1 | * | 10/2008 | Graur et al. | 716/19 |
| 2008/0282212 A1 | * | 11/2008 | Dennison et al. | 716/10 |
| 2009/0033368 A1 | * | 2/2009 | Pitts | 326/101 |
| 2010/0028809 A1 | * | 2/2010 | Vanleenhove et al. | 430/312 |
| 2010/0162187 A1 | * | 6/2010 | Penzes et al. | 716/2 |
| 2011/0018146 A1 | * | 1/2011 | Pierrat | 257/797 |

OTHER PUBLICATIONS

"Double patterning-Wikipedia, the free encyclopedia," (online) http://en.wikipedia.org/wiki/Double_patterning, downloaded Jan. 22, 2009, 5 pages.

* cited by examiner

*Primary Examiner* — Paul Dinh
(74) *Attorney, Agent, or Firm* — Slater & Matsil, L.L.P.

(57) ABSTRACT

A method of designing a double patterning mask set for a layout of a chip includes designing standard cells. In each of the standard cells, all left-boundary patterns are assigned with one of a first indicator and a second indicator, and all right-boundary patterns are assigned with an additional one of the first indicator and the second indicator. The method further includes placing the standard cells in a row of the layout of the chip. Starting from one of the standard cells in the row, indicator changes to the standard cells are propagated throughout the row. All patterns in the standard cells having the first indicator are transferred to a first mask of the double patterning mask set. All patterns in the standard cells having the second indicator are transferred to a second mask of the double patterning mask set.

20 Claims, 4 Drawing Sheets

METHODS FOR CELL BOUNDARY ISOLATION IN DOUBLE PATTERNING DESIGN

This application claims the benefit of U.S. Provisional Application No. 61/149,627 filed on Feb. 3, 2009, entitled "Methods for Cell Boundary Isolation in Double Patterning Design," which application is hereby incorporated herein by reference.

TECHNICAL FIELD

This invention relates generally to integrated circuit manufacturing processes, and more particularly to using double patterning technology to reduce the lithography limits of integrated circuits.

BACKGROUND

Double patterning is a technology developed for lithography to enhance the feature density. Typically, for forming features of integrated circuits on wafers, lithography technology is used, which involves applying a photo resist, and defining patterns on the photo resist. The patterns in the patterned photo resist are first defined in a lithography mask, and are defined either by the transparent portions or by the opaque portions in the lithography mask. The patterns in the patterned photo resist are then transferred to the underlying features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The features closely located are separated to two masks, with both masks used to expose the same photo resist. In each of the masks, the distances between features are increased over the distances between features in the otherwise single mask, and hence the optical proximity effect is reduced, or substantially eliminated.

However, double patterning technology cannot solve native conflict problems. For example, referring to FIG. 1, features 2, 4, and 6 are closely located with both distances S1 and S2 being small enough to cause the optical proximity effect. Therefore, the double patterning technology is used to increase the distances between features 2, 4, and 6. In this situation, regardless of how features 2, 4, and 6 are distributed to two masks of a double patterning mask set, there will always be a mask, in which there are two of the features 2, 4, and 6. Accordingly, there will be at least one distance S1 or S2 existing in the mask.

The native conflict can be avoided by carefully laying out circuits. However, this can be done without much difficulty at the cell level. When the cells, which may be free from native-conflict and free from rule violations, are put into the hierarchy of the circuits, the boundary features in neighboring cells may be too close to each other, and hence conflicts occur at this level. In other words, there is no guarantee that the double-patterning rule compliance is still satisfied when the cells are integrated. For example, referring to FIG. 2, there are two standard cells 10 and 12, with each of the standard cells 10 and 12 being native-conflict free. The patterns in FIG. 2 having different shadings are in different double patterning masks. When standard cells 10 and 12 abut to each other, as shown in FIG. 3, feature 14 in cell 10 will be to close to feature 16 in cell 12. Since features 14 and 16 are in a same mask, the layout of features 14 and 16 violates design rules. This problem is difficult to solve since even if a re-layout may be performed on cells 10 and 12 to solve the conflict between cells 10 and 12, there may be a ripple effect, which means other new conflicts may be generated between each of cells 10 and 12 and other abutted cells. Particularly, cells 10 and 12 are standard cells that may be used in many circuits in the same chip and in other chips. It is very difficult to predict the possible conflict that may occur to cells 10 and 12. What is needed, therefore, is a method and structure for overcoming the above-described shortcomings in the prior art.

SUMMARY OF THE INVENTION

In accordance with one aspect of the present invention, a method of designing a double patterning mask set for a layout of a chip includes designing standard cells. In each of the standard cells, all left-boundary patterns are assigned with one of a first indicator and a second indicator, and all right-boundary patterns are assigned with an additional one of the first indicator and the second indicator. The method further includes placing the standard cells in a row of the layout of the chip. Starting from one of the standard cells in the row, indicator changes to the standard cells are propagated throughout the row. All patterns in the standard cells having the first indicator are transferred to a first mask of the double patterning mask set. All patterns in the standard cells having the second indicator are transferred to a second mask of the double patterning mask set. Other embodiments are also disclosed.

The advantageous features of the present invention include reduced design effort for achieving a native-conflict-free design. Further, chip area usage of standard cells is also reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel double patterning design method and the respective double patterning mask sets are provided. The variations of the embodiment are then discussed. Throughout the various views and illustrative embodiments of the present invention, like reference numbers are used to designate like elements.

Figure 1:
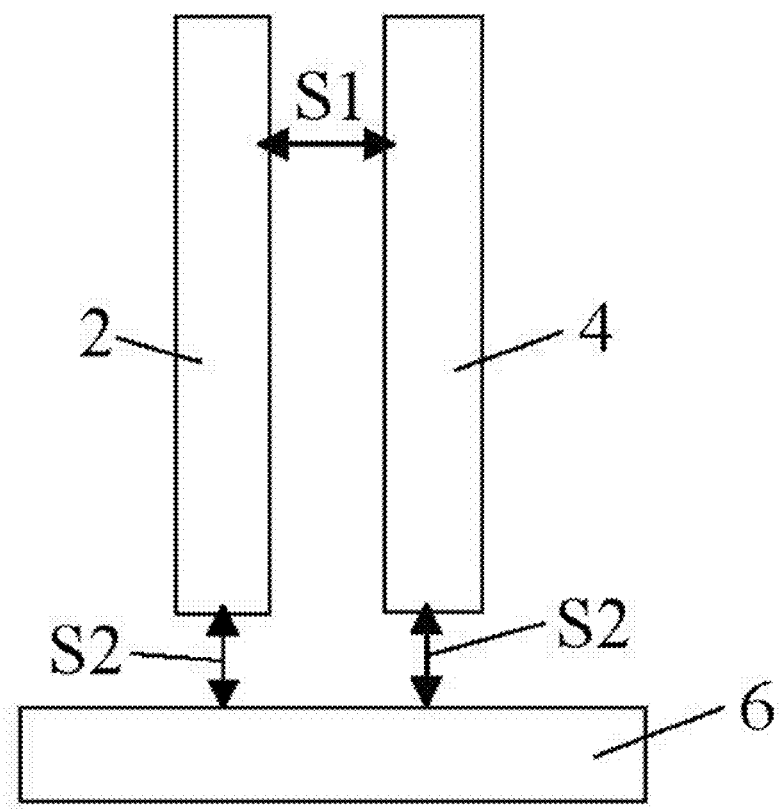
FIG. 1 illustrates an example of a native conflict occurring in the double patterning technology.
Figure 2:
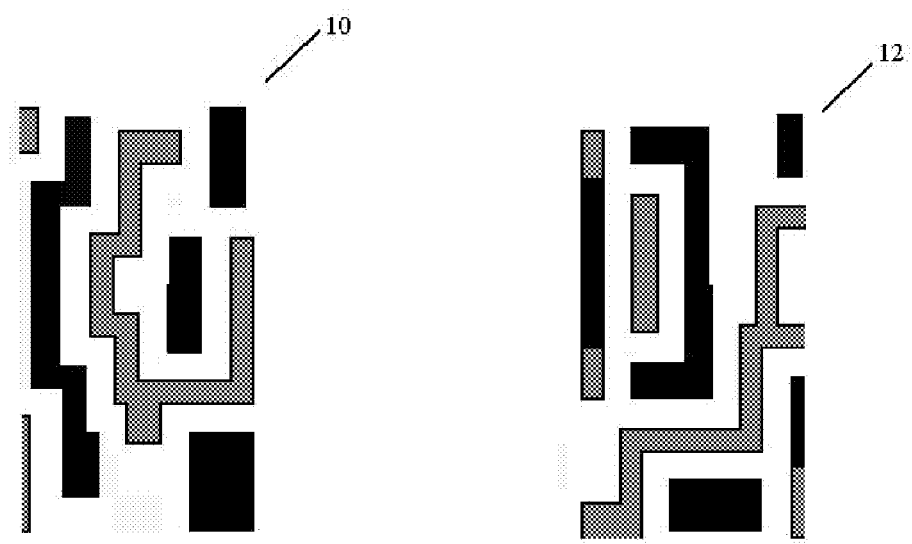
FIGS. 2 and 3 illustrate how design rules are violated when two standard cells are abutted, wherein each of the standard cells is free from rule violations and native conflicts.
Figure 3:
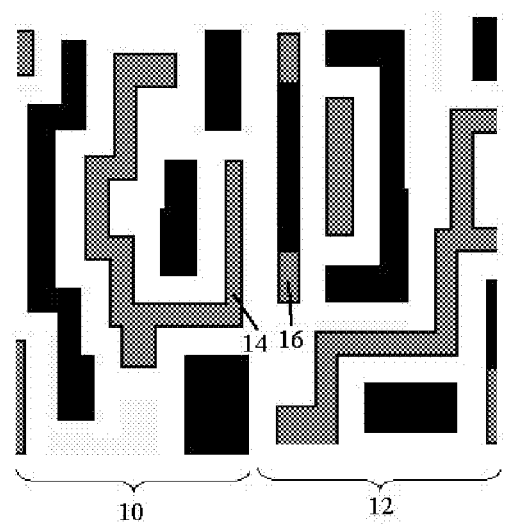
Figure 4:
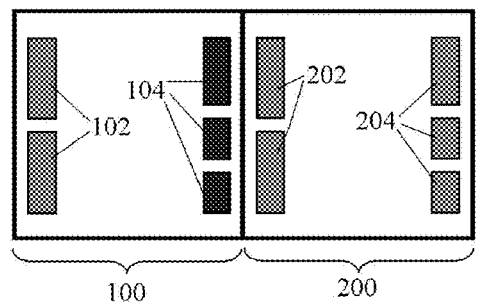
FIG. 4 illustrates an embodiment of the present invention, wherein patterns of standard cells are laid out using a uni-color scheme.

FIG. 4 illustrates an embodiment of the present invention, which includes cells 100 and 200 abutting each other. Cells 100 and 200 may be standard cells that may be saved in a cell library and copied into the layout of integrated circuits. The standard cells may include, but are not limited to, inverters, NOR gates, NAND gates, multiplexers, and the like. Alternatively, cells 100 and 200 may be custom cells. Each of cells 100 and 200 may include more than one type of features, including, but not limited to, polysilicon strips (or gate electrode strips formed of other conductive materials), diffusion regions, metal lines, and the like. Throughout the description, unless specified otherwise, the illustrated and discussed patterns in the standard cells are a same type of feature (for example, metal lines), and are located at a same level (for example, metal lines at metal layer M1).

Throughout the description, the patterns in a cell and immediately adjacent to the right boundary of the cell are referred to as right-boundary patterns (or R-patterns), and the patterns in the cell and immediately adjacent to the left boundary of the cell are referred to as left-boundary patterns (or L-patterns). In an embodiment, all R-patterns have a same distance from the right boundary of the respective standard cell while all L-patterns have a same distance from the left boundary of the respective cell, although the distance may also be slightly different from pattern to pattern. It is assumed that through careful layout design, the standard cells by themselves do not violate any design rules, and are conflict free when the features are decomposed into two or more masks of a same double patterning mask set. However, the L-patterns and R-patterns in the cell are potential candidates that can cause rule violations and conflicts when the cells are abutted with other cells and placed into the circuit hierarchy.

In an embodiment, a double patterning issue can be treated as a "coloring" issue, and the corresponding scheme is referred to as a color scheme. The patterns inside a cell can be assigned with two different colors: a first color and a second color. The patterns having the first color (referred to as being a first pattern set) will be transferred into a first mask, while the patterns having the second color (referred to as being a second pattern set) will be transferred into a second mask. The first and the second masks are lithography masks having transparent patterns allowing light to pass, and opaque patterns for blocking the light. The first mask and the second mask in combination form the double patterning mask set, and may be used to expose a photo resist for a same type of feature at a same level.

Referring to FIG. 4, in the layout design of cells 100 and 200, care is taken so that all of the R-patterns in each of cells 100 and 200 have a same color (in other words, are in a same pattern set and will be transferred into a same mask), and hence the R-patterns are uni-color patterns, wherein the uni-color may either be the first color or the second color. Similarly, all of the L-patterns in each of cells 100 and 200 have a same color (in other words, are in a same pattern set and will be transferred into a same mask), and hence all of the L-patterns are also uni-color patterns. For example, patterns 102 are uni-color patterns, patterns 104 are uni-color patterns, patterns 202 are uni-color patterns, and patterns 204 are also uni-color patterns. In FIG. 4, the different colors are indicated using different shadings. For simplicity, the non-boundary patterns between the R-patterns and the L-patterns in each of cells 100 and 200 are not shown, wherein the non-boundary patterns may have any of the first and the second colors, and most likely have a combination of the first and the second colors. There is no constraint on the coloring relationship between the R-patterns and the L-patterns in either cell 100 or 200. The R-patterns and the L-patterns in a cell can both have the first color, or both have the second color. Alternatively, R-patterns and L-patterns in a same cell may have different colors. In addition, the color of any of the cells may be inverted. For example, in cell 100, L-patterns 102 have the first color, while R-patterns 104 have the second color. However, the colors of cell 100 may be inverted so that L-patterns 102 have the second color, while R-patterns 104 have the first color. This may be achieved, for example, by designing two standard cells having essentially the same pattern except the colors are inverted. When the colors of L-patterns 102 and R-patterns 104 are inverted, the colors of non-boundary patterns are also inverted. In other words, in the inversion of the colors of cell 100, all of the patterns in cell 100 that originally would have been placed in the first mask are switched into the second mask, while all of the patterns in cell 100 that originally would have been placed in the second mask are switched into the first mask. The inversion of the colors in standard cells may be performed at a propagation time, during which the color changes are performed to all standard cells in a row, or the standard cells in a chip, if needed. The details are discussed in subsequent paragraphs.

With the uni-color R-patterns and L-patterns, the patterns in cells 100 and 200 may be laid out aggressively, so that they are very close to the respective boundaries. The uni-color R-patterns and L-patterns make it possible to put the R-patterns 104 in cell 100 and L-patterns 202 in cell 200 in two different masks. Accordingly, even if they are close to each other, no optical proximity effect will occur.

Figure 5:
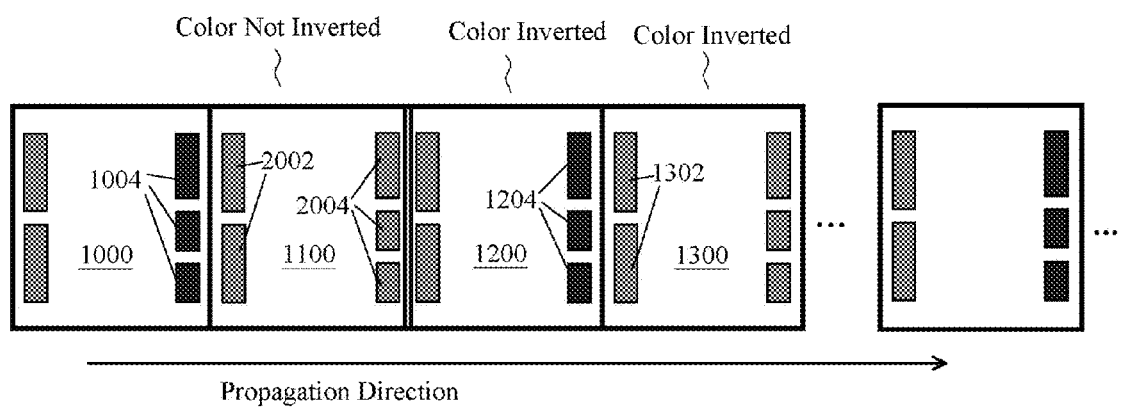
FIG. 5 illustrates how the uni-color scheme is used to solve conflicts in a row of abutted standard cells.

Problems arise when a plurality of uni-color standard cells are placed in a same row, with each of the standard cells abutting two neighboring cells, except the first cell and the last cell in the row. A color propagation may thus be performed to ensure that all R-patterns in any cell in the row have a different color than the L-patterns in the abutted cell on its right side, and all L-patterns in any cell in the row have a different color than the R-patterns in the abutted cell on its left side. The color propagation may be performed as follows. First, any cell in the row may be selected as a base cell, and the colors of the patterns in other cells are determined and propagated one-by-one from the cells closer to the base cell to the cells farther away from the base cell. The color determination of each of the cells is based on the colors of the abutting cell that has just been determined/changed. For example, referring to FIG. 5, cell 1000 is the base cell. The colors of cell 1100 are determined based on the color of R-patterns 1004 in cell 1000 and the color of L-patterns 2002 in cell 1100. If the color of L-patterns 2002 is different from the color of R-patterns 1004, the colors of patterns in cell 1100 are not inverted. Conversely, if the color of L-patterns 2002 is the same as the color of R-patterns 1004, the colors of cell 1100 are inverted, with the first color being changed to the second color, and the second color being changed to the first color. In an exemplary embodiment as shown in FIG. 5, the colors of cell 1100 are not inverted. The colors of cell 1200 are then determined by comparing to the color of the R-patterns 2004 in cell 1100 using a similar method as used for determining the colors of cell 1100. In the illustrated example, the colors of cell 1200 need to be inverted. Accordingly, due to the color inversion of cell 1200, the color of L-patterns 1302 will be the same as the color of R-patterns 1204, and hence the colors of cell 1300 also need to be inverted. The color propagation may be performed all the way throughout the row in the propagation direction(s).

The base cell may be selected from any cell in the row, and the color propagation may be performed to the right, to the left, or to both the right and the left. Using this method, rule violations will not occur to any of the abutted cells in a row, and will not occur to any row in the chip, when the propagation of color change is performed to all rows in the chip. After the color propagation, masks may be formed, wherein the patterns in the first pattern set are transferred to the first mask of the double patterning mask set, while the patterns in the second pattern set are transferred to the second mask of the double patterning mask set.

Please note that a row may include thousands of standard cells, or even as many as millions of standard cells, wherein substantially all, for example, greater than about 90 percent, or even greater than about 95 percent, or even greater than about 99 percent of the cells in the row may be formed using the uni-color scheme, while remaining cells may have other layouts, for example, including buffer zones as discussed in subsequent paragraphs. In addition, substantially all, for example, greater than about 90 percent, or even greater than about 95 percent, or even greater than about 99 percent of the cells in the entire chip may be formed using the uni-color scheme. Further, the standard cells in the row may have more than about 100 types of standard cells and/or layouts different from each other.

Figure 6:
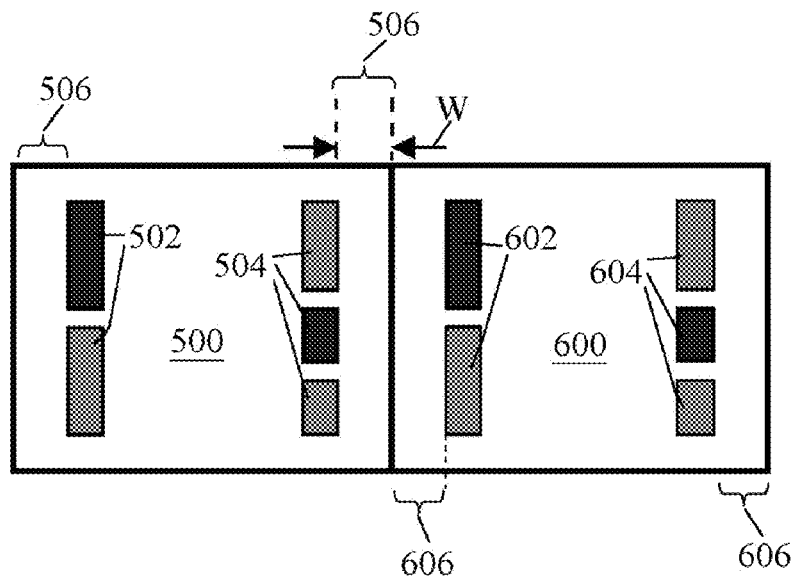
FIG. 6 illustrates an alternative embodiment of the present invention, wherein buffer zones are added to solve the conflict that may occur between abutted cells.

In alternative embodiments, as shown in FIG. 6, instead of using the uni-color scheme, buffer zones 506 may be inserted to space L-patterns 502 and R-patterns 504 apart from the left and right boundaries of cell 500, respectively. Similarly, buffer zones 606 may be inserted to space L-patterns 602 and R-patterns 604 apart from the left and right boundaries of cell 600, respectively. The width W of buffer zones 506 and 606 is great enough to ensure that even if patterns 504 and 602 have the same color (in a same mask), no rule violation will occur. In an embodiment, all of the cells in a chip have buffer zones, thus it can be ensured that when the cells are abutted, no rule violation will occur regardless of the colors of the boundary patterns of the cells. In other embodiments, the cells having the buffer zones may be integrated with the cells designed using the uni-color scheme. In the embodiment shown in FIG. 6, L-patterns 502 and 602 and right patterns 504 and 604 may be uni-color patterns, or dual-color patterns.

Figure 7:
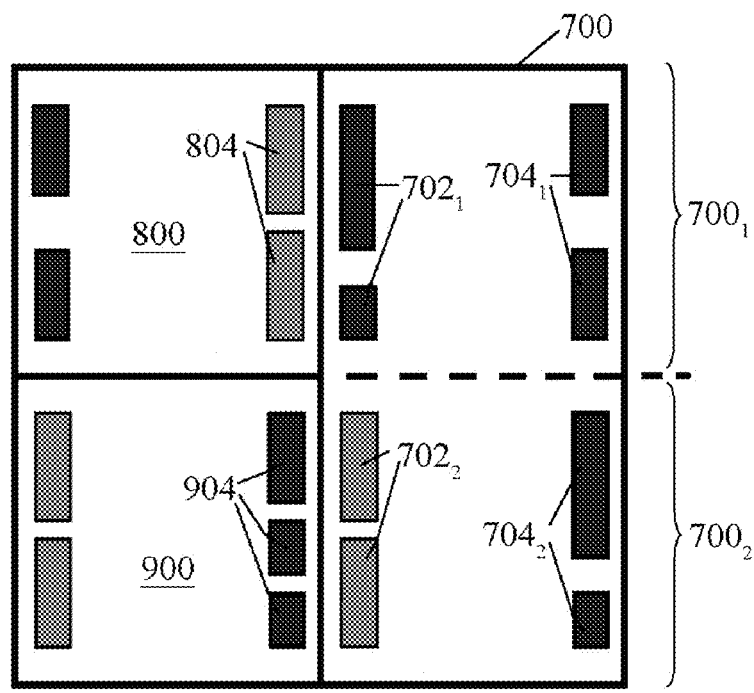
FIG. 7 illustrates how the uni-color scheme applies to a multi-height standard cell abutted to unit-height standard cells.

In a chip, there may be a plurality of cells having a same cell height, which is actually a length or a width in a plane parallel to the surface of the respective chip. There may also be multi-height cells whose cell heights are multiple times the height of other cells. For example, FIG. 7 illustrates a double-height cell 700 abutting unit-height cells 800 and 900. Throughout the description, cells 800 and 900 are referred to as unit-height cells, and the height of cells 800 and 900 are referred to as a unit height. In the illustrated exemplary embodiment, the colors of R-patterns 804 and 904 have different colors, and hence L-patterns $702_1$ and $702_2$ cannot have a uni-color that is different from both colors of R-patterns 804 and 904. To solve this problem, in an embodiment, cell 700 is partitioned into top portion $700_1$ having a same height as cell 800, and bottom portion $700_2$ having a same height as cell 900. L-patterns $702_1$ in top portion $700_1$ need to have a uni-color, and R-patterns $704_1$ in top portion $700_1$ need to have a uni-color. Further, L-patterns $702_2$ in bottom portion $700_2$ need to have a uni-color, and R-patterns $704_2$ in bottom portion $700_2$ need to have a uni-color. L-patterns $702_1$ and R-patterns $704_1$ may have the flexibility of being either of the same or different colors, and L-patterns $702_2$ and R-patterns $704_2$ may have the flexibility of being either of the same or different colors. In other embodiments, each of top portion $700_1$ and bottom portion $700_2$ of cell 700 may be treated as a separate cell, and the colors of the patterns in either top portion $700_1$ or bottom portion $700_2$ may be changed similar to cells 100 and 200 (refer to FIG. 4), as discussed in the preceding paragraphs. In yet other embodiments, multi-height cells such as cell 700 may have buffer zones, so that they can be integrated with cells designed using the uni-color scheme.

In addition, although the embodiments of the present invention use the term "color" to indicate which patterns will be decomposed to which of the two masks, any other indicators that can achieve the same function may also be used, and are in the scope of the present invention. These indicators include, but are not limited to, different shadings, different representing reference numerals, different gray levels, and the like, and hence the term "color" may be interpreted as covering these indicators. Further, if the double patterning mask set includes three or more masks, the concept discussed in the preceding paragraphs may also apply, with three or more different colors used.

In the embodiments discussed in the preceding paragraphs, the abutting of cells in a row is discussed, and hence the colors of left and right patterns are discussed. One skilled in the art will realize that row direction and column direction are interchangeable concepts, depending on the orientation from which the chip is viewed. Accordingly, the concept regarding the rows may also be applied to columns of cells, with top-boundary patterns and bottom-boundary patterns corresponding to left-boundary patterns and right-boundary patterns in rows. Accordingly, the top-boundary patterns and bottom-boundary patterns may also have uni-colors, and may be propagated to solve the possible conflict between the top and/or bottom boundary patterns in the abutting cells in the same column. Further, the concept of the embodiments may also be applied in the row direction and column direction at the same time.

The embodiments have several advantageous features. By using the uni-color scheme or adding buffer zones, rule violations will not occur when cells are integrated and are placed in the design hierarchy. Further, the embodiments may fully take the advantageous feature provided by the double patterning technology to reduce chip area usage by further reducing the distances between boundary patterns and the respective boundaries of the cells.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of designing a double patterning mask set for a layout of a chip, the method comprising:
designating a first pattern set;
designating a second pattern set;
designing a cell comprising a left boundary and a right boundary, wherein all left-boundary patterns in the cell are in a same pattern set selected from a pattern set group substantially comprising the first pattern set and the second pattern set, and all right-boundary patterns in the cell are in a same pattern set selected from the pattern set group;
switching the left-boundary patterns to a different pattern set in the first pattern set and the second pattern set;
switching the right-boundary patterns to a different pattern set in the first pattern set and the second pattern set;
creating a first patterned mask by transferring patterns in the first pattern set into a first mask of the double patterning mask set; and
creating a second patterned mask by transferring patterns in the second pattern set into a second mask of the double patterning mask set.

2. The method of claim 1 further comprising placing the cell in a row of the layout of the chip and abutting an additional cell, wherein the steps of switching the left-boundary patterns and switching the right-boundary patterns are performed after the step of placing the cell.

3. The method of claim 2 further comprising:
switching additional left-boundary patterns of the additional cell to a different one of the first pattern set and the second pattern set; and
switching additional right-boundary patterns of the additional cell to a different one of the first pattern set and the second pattern set.

4. The method of claim 2 further comprising placing the additional cell in the row, wherein additional left-boundary patterns and additional right-boundary patterns of the additional cell are not switched to different pattern sets.

5. The method of claim 1, wherein the cell is a standard cell.

6. A method of designing a double patterning mask set for a layout of a chip, the method comprising:
designing standard cells each having a left boundary and a right boundary, wherein in each of the standard cells, all left-boundary patterns are assigned an indicator selected from an indicator group consisting of a first indicator and a second indicator, and all right-boundary patterns are assigned with an additional indicator selected from the indicator group, and
wherein the first indicator is different from the second indicator;
placing the standard cells in a row of the layout of the chip, with neighboring standard cells abutting each other;
starting from one of the standard cells in the row, propagating indicator changes to the standard cells in the row;
creating a first patterned mask by transferring all patterns in the standard cells having the first indicator to a first mask of the double patterning mask set; and
creating a second patterned mask by transferring all patterns in the standard cells having the second indicator to a second mask of the double patterning mask set.

7. The method of claim 6, wherein the first indicator is a first color, and the second indicator is a second color.

8. The method of claim 6, wherein substantially all of the standard cells in the row have uni-indicator left-boundary patterns, and uni-indicator right-boundary patterns.

9. The method of claim 6, wherein substantially all of the standard cells in all rows in the layout of the chip have uni-indicator left-boundary patterns, and uni-indicator right-boundary patterns.

10. The method of claim 6, wherein, after the step of propagating indicator changes, in the row, all the right-boundary patterns of any standard cell in the row are assigned with a different indicator than all the left-boundary patterns of an additional standard cell on a right side and abutting the any standard cell.

11. The method of claim 6, wherein each of the standard cells is configured so that the first indicator and the second indicator can be inverted.

12. The method of claim 6, wherein patterns in the standard cells are selected from the group consisting essentially of polysilicon strips, diffusion regions, and metal lines.

13. The method of claim 6 further comprising designing a multi-height cell partitioned into a top portion and a bottom portion, wherein:
top left patterns of the multi-height cell are uni-indicator patterns;
top right patterns of the multi-height cell are uni-indicator patterns;
bottom left patterns of the multi-height cell are uni-indicator patterns; and
bottom right patterns of the multi-height cell are uni-indicator patterns.

14. The method of claim 6 further comprising abutting an additional standard cell into the row, wherein the additional standard cell comprises a left buffer zone and a right buffer zone, and wherein patterns selected from the group consisting essentially of left-boundary patterns and right-boundary patterns of the additional standard cell are not uni-indicator patterns.

15. A method of designing a double patterning mask set for a layout of a chip, the method comprising:
designing a plurality of standard cells each having a left boundary and a right boundary, wherein all left-boundary patterns in each of the standard cells are in a pattern set from a pattern set group consisting of a first pattern set and a second pattern set, and all right-boundary patterns in each of the standard cells are in a pattern set from the pattern set group;
placing the standard cells in a row of the layout of the chip, with neighboring standard cells abutting each other;
creating a first patterned mask by transferring all patterns in the first pattern set into a first mask of the double patterning mask set; and
creating a second patterned mask by transferring all patterns in the second pattern set into a second mask of the double patterning mask set.

16. The method of claim 15 further comprising, after the step of placing the standard cells in the row, starting from one of the standard cells in the row, propagating pattern set changes to all remaining standard cells in the row.

17. The method of claim 16, wherein, after the step of propagating the pattern set changes, in the row, all the right-boundary patterns of any standard cell in the row are in a different pattern set than the left-boundary patterns of an additional standard cell on a right side and abutting the any standard cell.

18. The method of claim 15 further comprising abutting an additional standard cell to one of the standard cells, wherein the additional standard cell comprises a left buffer zone and a right buffer zone, and wherein patterns selected from the group consisting essentially of left-boundary patterns and right-boundary patterns of the additional standard cell are not in a same pattern set.

19. The method of claim 15 further comprising abutting a multi-height cell to a cell in the standard cells, wherein the multi-height cell is partitioned into a top portion and a bottom portion, and wherein:

top left patterns of the multi-height cell are in a same pattern set;

top right patterns of the multi-height cell are in a same pattern set;

bottom left patterns of the multi-height cell are in a same pattern set; and bottom right patterns of the multi-height cell are in a same pattern set.

20. The method of claim 19 further comprising:

after the step of abutting the multi-height cell, switching one group of the top left patterns, the top right patterns, the bottom left patterns, and the bottom right patterns from a pattern of the pattern set group into the other pattern of the pattern set group.

\* \* \* \* \*